United States Patent [19]

Kobayashi et al.

[11] Patent Number: 4,823,346
[45] Date of Patent: Apr. 18, 1989

[54] MAXIMUM LIKELIHOOD DECODER

[75] Inventors: Naoya Kobayashi, Musashino; Makoto Ohnishi, Tokyo; Yoshiro Kokuryo, Tachikawa, all of Japan

[73] Assignees: Hitachi, Ltd.; Hitachi Denshi Kabushiki, both of Tokyo, Japan

[21] Appl. No.: 39,030

[22] Filed: Apr. 16, 1987

[30] Foreign Application Priority Data

Apr. 16, 1986 [JP] Japan .................................. 61-85982
Apr. 16, 1986 [JP] Japan .................................. 61-85983

[51] Int. Cl.⁴ .............................................. G06F 11/10
[52] U.S. Cl. ..................................................... 371/43
[58] Field of Search ............................. 371/43, 44, 45

[56] References Cited

U.S. PATENT DOCUMENTS 4,520,490  5/1985  Wei ..................................... 371/43 X
4,586,182  4/1986  Gallager ........................... 371/43 X
4,660,214  4/1987  Pahlavan et al. .................. 371/43 X
4,700,349  10/1987  Gallager ........................... 371/43 X
4,713,817  12/1987  Wei ..................................... 371/43

OTHER PUBLICATIONS

Wei, Rotationally Invariant Convolutional Channel Coding with Expanded Signal Space-Part II: Nonlinear Codes, IEEE Journal of Selected Areas in Comm., vol. SAC-2, No. 5, Sep. 1984, pp. 672-686.

Primary Examiner—Charles E. Atkinson
Attorney, Agent, or Firm—Antonelli, Terry & Wands

[57] ABSTRACT

A maximum likelihood decoder for decoding a code from a signal transmitted through quadrature amplitude modulation of a code including a convolutional code can decode at high speed and high accuracy with a simple hardware configuration. In the maximum likelihood decoding of the convolutional code, the metric processing is not carried out for all of the possible paths and states but a smaller number of path(s) (metric(s)) and state(s) (metric(s)) are selected in a descending order to determine survival paths.

4 Claims, 9 Drawing Sheets

CONSTELLATION

FIG. 8

DOMAIN  X: RECEIVED POINT  A~H: 8 ADJACENT POINTS

FIG. 9

MAXIMUM LIKELIHOOD DECODER

BACKGROUND OF THE INVENTION

The present invention relates to a decoder of an error correcting code, and more particularly to a maximum likelihood decoder such as Viterbi decoder which adds, compares and selects state metric and path metric along each path of a trellis diagram.

The maximum likelihood decoder selects a sequence out of all the transmitted sequences which is most likely to match the received data sequence and determines corresponding digital (data) information. In order to determine the maximum metric, it performs so-called ACS operation (Addition, Comparison and Selection).

In the maximum likelihood decoder, processing time for ACS rapidly increases with the growing number of states of the convolutional code. When the number of states is more than eight, it becomes quite difficult to attain a practical decoder in view of the processing time.

SUMMARY OF THE INVENTION

It is an object of the present invention to provide a maximum likelihood decoder which can provide high error rate performance with a simple hardware configuration.

In order to achieve this object, in accordance with the present invention, a path metric of an input signal is determined by a reference signal, then some instead of all the combinations of path metric and state metric are added, compared and selected along the trellis diagram, the resulting state metric is supplied to a normalization circuit, a survival path is stored, and the trellis diagram is traced back along the survival path over the truncated length to produce a decoded output. Means for selecting m states and n paths, in a descending order from M state metrics and M path metrics which are present one symbol time before the current status determined by the trellis diagram (where $0 \leq m < M$, $1 \leq n < M$, $m+n \geq 2$, M, m and n are natural numbers), and means for determining a combination of addition, comparison and selection in accordance with the selected states and paths are provided so that the addition, comparison and selection are performed only to the m state metrics and n path metrics.

As described above, in the maximum likelihood decoder of the present invention, m state metrics and n path metrics are selected in the descending order (where $0 \leq m < M$, $1 \leq n < M$ and $m+n \geq 2$), so that only those metrics are added, compared and selected. Accordingly, a higher processing speed is attained than a conventional maximum likelihood decoder which adds, compares and selects along all the paths of the trellis diagram.

The above and other features and the objects of the present invention will become more apparent by referencing to the following description taken in conjunction with the accompanying drawings.

DESCRIPTION OF THE PREFERRED EMBODIMENTS

Figure 1:
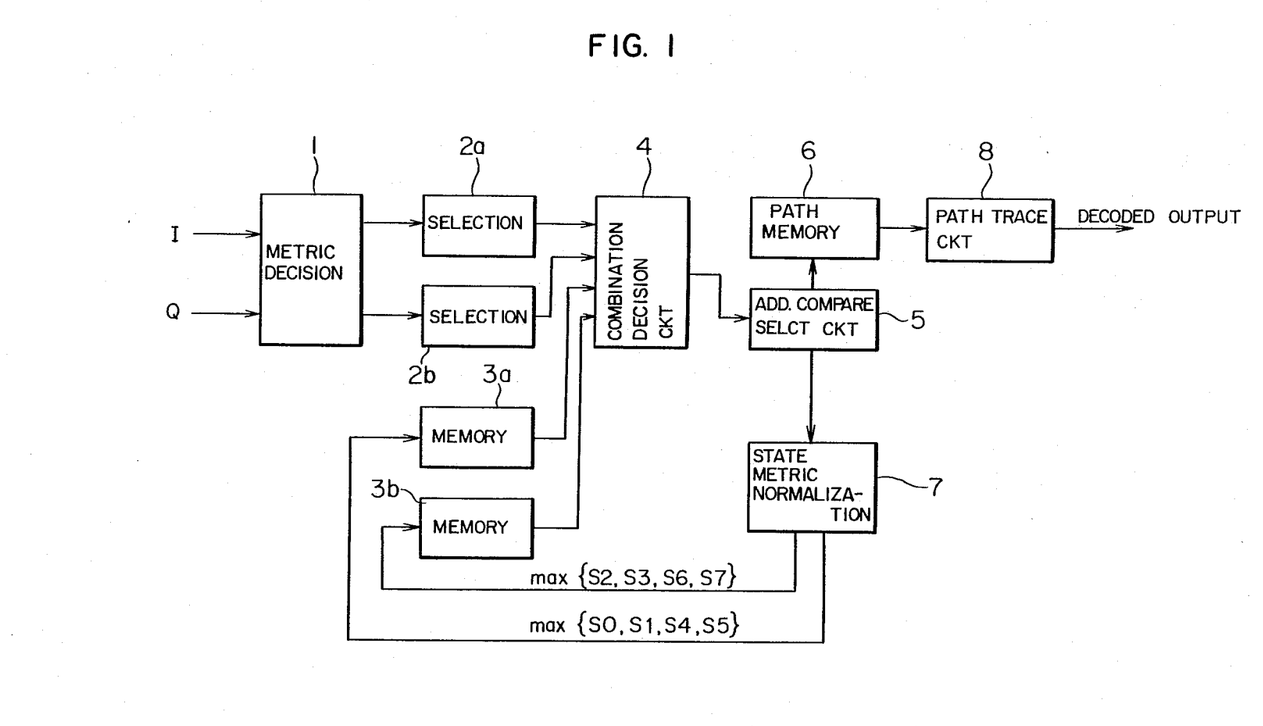
FIG. 1 shows a block diagram of the embodiment in a maximum likelihood decoder of the present invention.

FIG. 1 shows a block diagram of the maximum likelihood decoder of the present invention. Numeral 1 denotes a path metric decision circuit, numerals 2a and 2b denote selection circuits, numerals 3a and 3b denote memories, numeral 4 denotes an add/compare/select combination decision circuit, numeral 5 denotes an add/compare/select circuit, numeral 6 denotes a path memory, numeral 7 denotes a state metric normalization circuit, and numeral 8 denotes a path tracing circuit.

Prior to the explanation of the operation of the present embodiment, the convolutional code to be decoded and received signals I, Q in FIG. 1 are explained.

Figure 2:
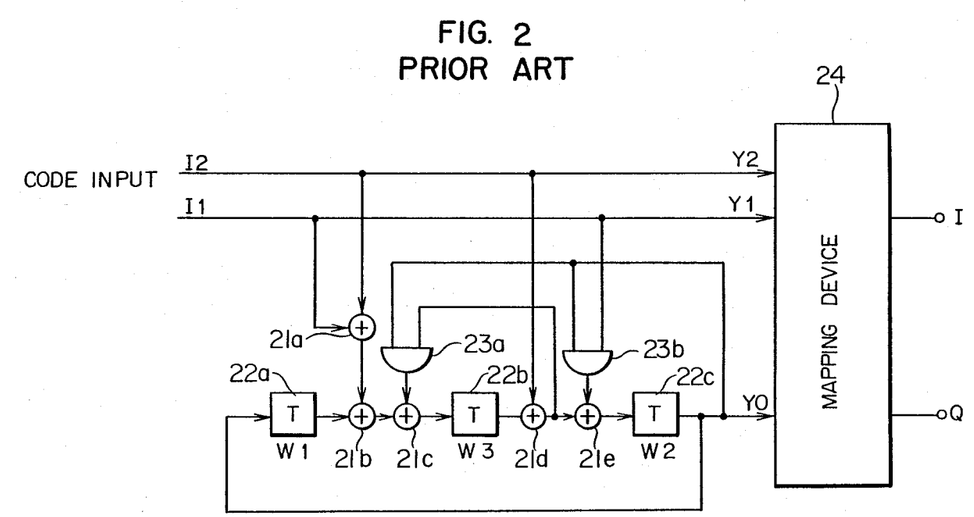
FIG. 2 shows a circuit diagram of a known coder for generating a convolutional code, which has been recommended in CCITT.
Figure 3:
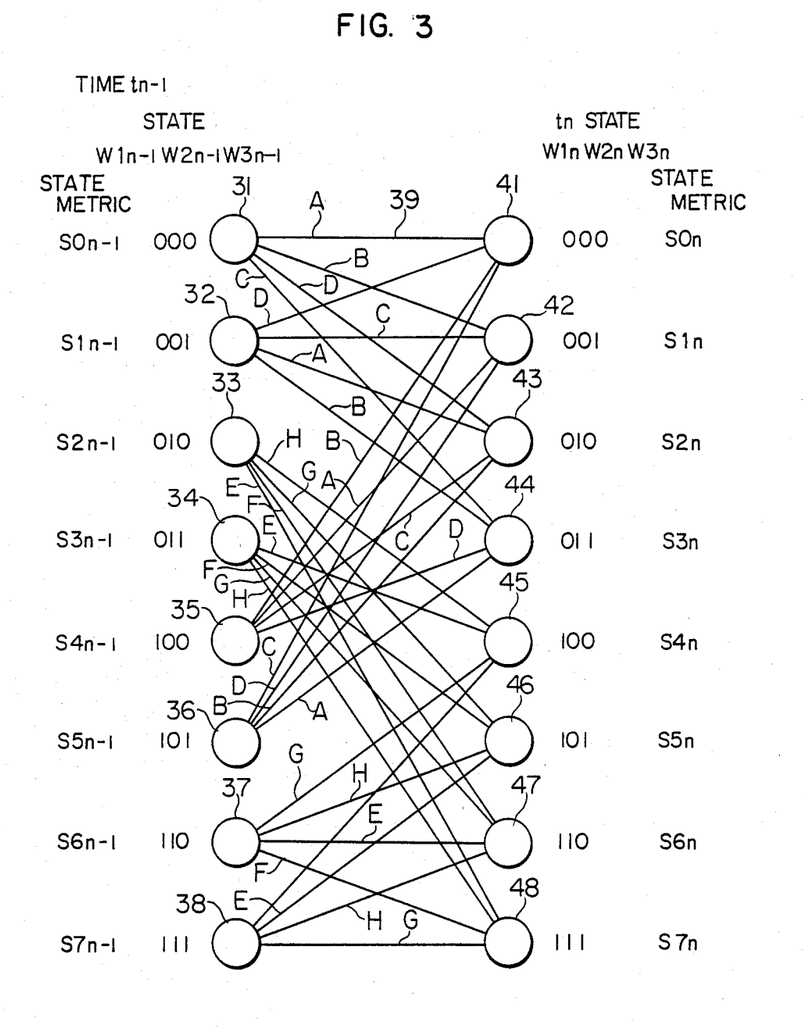
FIG. 3 shows a diagram describing state transistions in the convolutional coder.

FIG. 2 shows a convolutional coder for generating a code signal to be supplied to the decoder of the present invention. This coder is a known one (for example, disclosed in U.S. Pat. No. 4,483,012), and so, detailed explanation is omitted. In FIG. 2, numerals 21a–21e denote exclusive OR gates, numerals 22a–22c denote 1—symbol interval delay elements, and numerals 23a and 23b denote AND gates. Two-bit information sequences I2 and I1 are convolutionally coded to generate three-bit code sequences Y2, Y1 and Y0 by the coder of FIG. 2. The contents (or state) W1, W2 and W3 of the delay elements in the coder are newly determined by the sequences I2 and I1, and the state before 1 symbol interval. FIG. 3 shows the state transition diagram of the coder output which is called a trellis diagram. In FIG. 3, numerals 31-38 denote the states $W1_{n-1}$, $W2_{n-1}$ and at time $t_{n-1}$, numerals 41-48 denote the states $W1_n$, $W2_n$ and $W3_n$ at time $t_n$, and numeral 39 denotes a path showing the transition from the state at time $t_{n-1}$ to the state at time $t_n$ A, B, C, D, E, F, G and H denote coder outputs Y2, Y1, Y0=000, 010, 100, 110, 011, 101, 111 and 001, respectively. Code sequence Y2, Y1, Y0 is converted into the orthogonal component signals I and Q by a mapping device or constellation 24, and the signals I and Q are transmitted by quadrature amplitude modulation (QAM).

A receiver decodes the signals I and Q that are demodulated (from the quadrature amplitude modulated signal) and supplies to the path metric decision circuit 1.

The path metric decision circuit 1 determines the value representing an Euclidean distance between the input signals I and Q and reference signals corresponding to the δ adjacent signal points A, B, ..., H. It comprises a ROM which is addressed by digital values of the input signals I and Q to produce path metrics against these signal points A, B, ..., H. The path metric outputs at the current time n are represented by PAn, PBn, ..., PHn.

After the path metrics have been determined, m metrics of the states which are present one symbol time before ($t_{n-1}$) and n metrics of the paths which are present at time $t_n$ are selected in the descending order on the trellis diagram (FIG. 3), where m and n meet $0 \leq m < 4$, $1 \leq n < 4$ and $m+n \geq 2$. In the present embodiment, $m=n=1$ and hence only the maximum state metric and path metric are selected. The maximum state metric has been determined in the process of normalization of the state metrics produced one symbol time before ($t_{n-1}$), and stored in the memories 3a and 3b. In the present embodiment, the maximum state metric and path metric are determined in the following manner. Referring to FIG. 3, the states $W1_n$, $W2_n$, $W3_n = 000, 001, 010$ and 011 at time $t_n$ are transmitted from the states $W1_{n-1}$, $W2_{n-1}$, $W3_{n-1} = 000, 001, 100$ and 101 at time $t_{n-1}$, and each of paths corresponds to one of the paths A, B, C and D. Also, $W1_n$, $W2_n$, $W3_n = 100, 101, 110$ and 111 are transitted from $W1_{n-1}$, $W2_{n-1}$, $W3_{n-1} = 010, 011, 110$ and 111, and each of the paths corresponds to one of the paths E, F, G and H. Noticing the structure of this trellis diagram, state metrics $\widetilde{S0}_{n-1}, \widetilde{S1}_{n-1}, \ldots, \widetilde{S7}_{n-1}$ at time $t_{n-1}$ where ~ means state metric value, and path metrics PAn, PBn, ..., PHn at time $t_n$ are divided into two sets of groups $\{\widetilde{S0}_{n-1}, \widetilde{S1}_{n-1}, \widetilde{S4}_{n-1}, \widetilde{S5}_{n-1}\}$, $\{\widetilde{S2}_{n-1}, \widetilde{S3}_{n-1}, \widetilde{S6}_{n-1}, \widetilde{S7}_{n-1}\}$ and $\{PA_n, PB_n, PC_n, PD_n\}$, $\{PE_n, PF_n, PG_n, PH_n\}$.

In FIG. 1, the selection circuits 2a and 2b and the memories 3a and 3b select the maximum value out of the groups $\{PA_n, PB_n, PC_n, PD_n\}$ and $\{PE_n, PF_n, PG_n, PH_n\}$, $\{\widetilde{S0}_{n-1}, \widetilde{S1}_{n-1}, \widetilde{S4}_{n-1}, \widetilde{S5}_{n-1}\}$ and $\{\widetilde{S2}_{n-1}, \widetilde{S3}_{n-1}, \widetilde{S6}_{n-1}, \widetilde{S7}_{n-1}\}$, respectively.

The combination decision circuit 4 determines the combination of addition, comparison and selection in accordance with the types of the paths and states selected by the selection circuits 2a and 2b and the memories 3a and 3b.

For example, if the selection circuits 2a and 2b and the memories 3a and 3b select PBn and PFn; and $\widetilde{S1}_{n-1}$ and $\widetilde{S6}_{n-1}$, respectively, the state metrics $\widetilde{S0}_n, \ldots, \widetilde{S7}_n$ at time $t_n$ are determined based on the selected path metrics and state metrics. The state metrics $\widetilde{S0}_n$ and $\widetilde{S4}_n$ at time n are given as follows (see FIG. 3).

$$\widetilde{S0}_n = \max \{\widetilde{S1}_{n-1} + PD_n, \widetilde{S4}_{n-1} + PB_n\} \quad (1)$$

$$\widetilde{S4}_n = \max \{\widetilde{S6}_{n-1} + PG_n, \widetilde{S7}_{n-1} + PF_n\} \quad (2)$$

where max means to select the maximum value in { }. If both are equal, any one of them is selected. The path corresponding to the selected value is stored in the path memory 6 as a survival path.

For example, in (1), if $$\widetilde{S1}_{n-1} + PD_n < \widetilde{S4}_{n-1} + PB_n$$

the path connecting the state $S4_{n-1}$ and $S0_n$ that is B is the survival path and the code B is stored in the memory 6. A survival path for states $S1_n, \ldots, S3_n, S5_n, \ldots, S7_n$ is determined in the same manner. As seen from (1) and (2), only two paths (instead of four) need be processed in the present embodiment comparing with the conventional method where addition, comparison and selection are performed for all of the four paths. Therefore, the processing is simplified.

In practical use of Viterbi decoding, state metric should be normalized because the range of metric value is finite in a real system. The normalization is realized through the next procedure.

(1) Select the maximum metric Smax of the 8 states.

(2) Subtract $(Smax - (2^k - 1))$ from each state metric where k is the number of bits to present state metric.

(3) When the results of (2) are less than 0, they are set 0.

By this process, the maximum state metric is always $2^k - 1$ and is expressed within k bits.

The normalization circuit 7 also normalizes the state metrics resulting from the addition, comparison and selection. In this process, max $\{\widetilde{S0}_n, \widetilde{S1}_n, \widetilde{S4}_n, \widetilde{S5}_n\}$ and max $\{\widetilde{S2}_n, \widetilde{S3}_n, \widetilde{S6}_n, \widetilde{S7}_n\}$ are determined and stored in the memories 3a and 3b, respectively. The path tracing circuit 6 traces back the path over the truncated length according to the survival path information stored in the path memory 6 to estimate the state and corder output at the trace-back time. Finally, the redundant bit Y0 in the estimated coder output Y2, Y1, Y0 is erased so that the information sequence Y2, Y1 is produced.

The processing time of the addition, comparison and selection circuit (5 of FIG. 1) is shorter than that of the conventional method, and the larger the number of states is, the more the processing time is shortened. Accordingly, high speed decoding is attained.

In the decoder of the present invention, the smaller m and n are, the higher is a processing speed. In the above-mentioned embodiment, $m=n=1$. Alternatively, $m=0$ and $n=2$ may be selected. In this case, the maximum and the next maximum of the paths at time $t_n$ are selected and they are added, compared and selected only for them. The memories 3a and 3b of FIG. 1 are not necessary.

Figure 4:
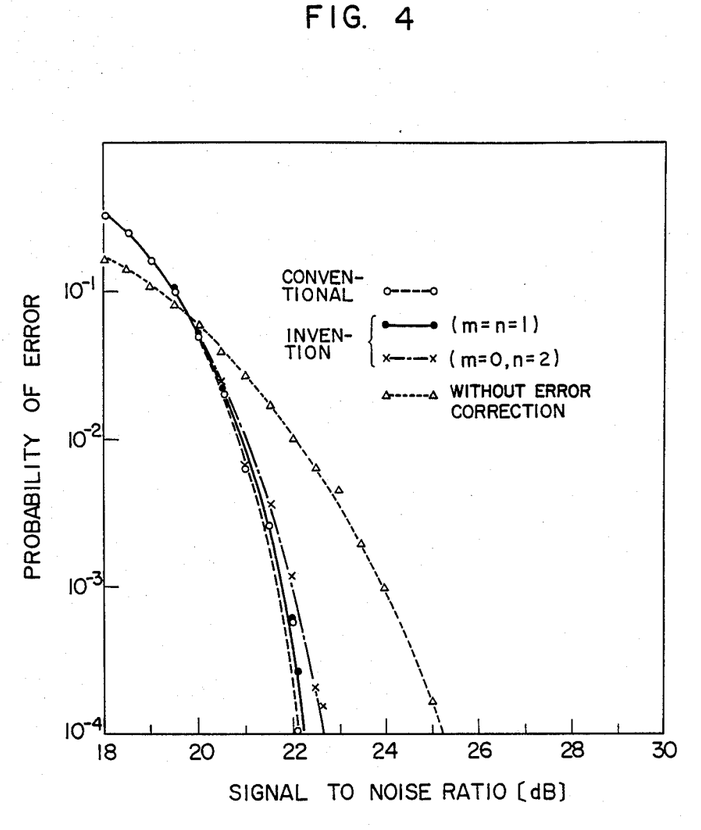
FIG. 4 shows simulation results of decoding error rate by the decoder of the present invention.

FIG. 4 shows simulation results of an error rate of the present decoder compared with that of a conventional decoder. In FIG. 4, · ——— · and × ---- × show symbol error rates when the addition, comparison and selection are performed only for the maximums of the state metrics and path metrics ($m=n=1$), and only for the maximum and the next to the maximum of the path metrics ($m=0, n=2$) respectively. In both cases, performance degradation from the conventional system is small. In the former case ($m=n=1$), the performance is essentially identical to that of the conventional system.

Figure 5:
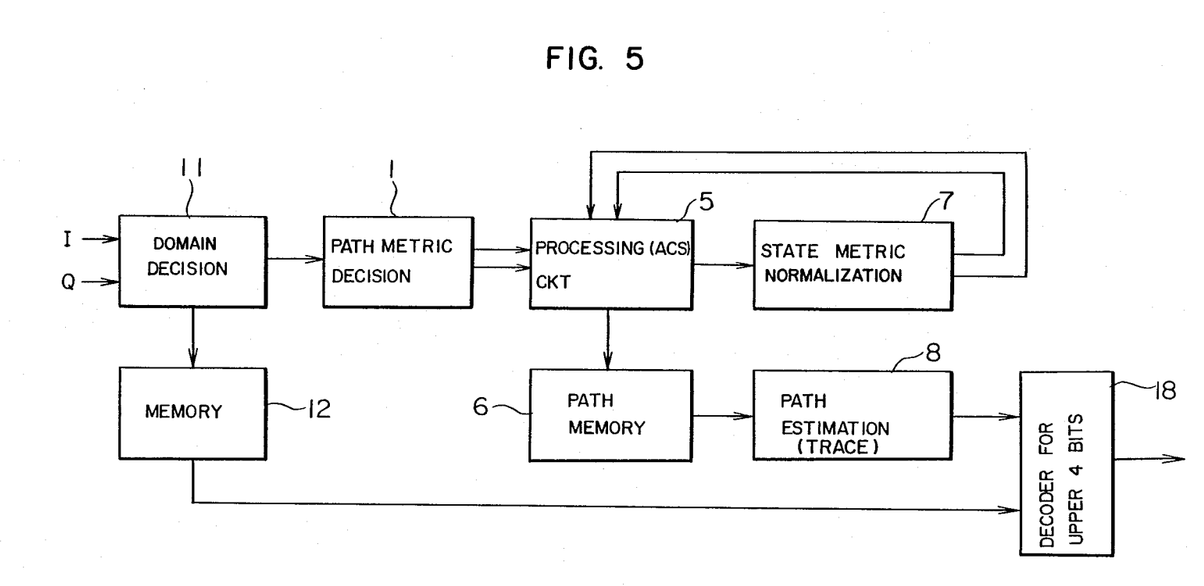
FIG. 5 shows a configuration of another embodiment of the decoder of the present invention.

FIG. 5 shows a block diagram of another embodiment of the maximum likelihood decoder of the present invention.

Figure 6:
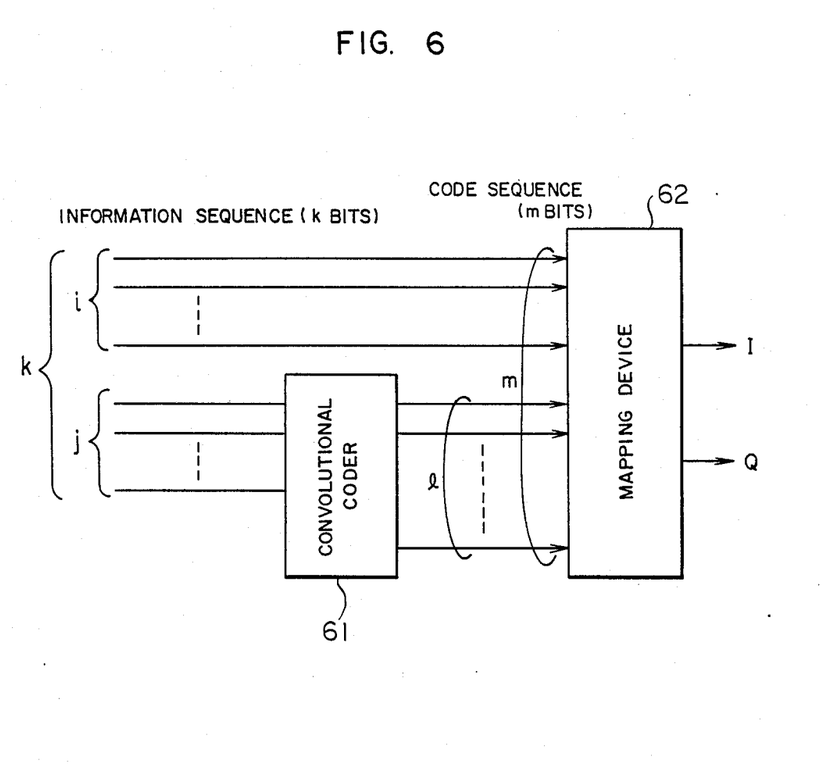
FIG. 6 shows a configuration of a coder which generates a signal to be received by the decoder of FIG. 5.

In the present embodiment, a signal to be decoded is produced by a coder and a signal point (mapping device and quadrature amplitude modulator) shown in FIG. 6. Construction and operation of such a coder are disclosed in U.S. Pat. No. 4,483,012. In FIG. 6, numeral 61 denotes a convolutional encoder and numeral 62 denotes a mapping device. Of a k-bit information code sequence which is serial-parallel converted at time n, only lower $j(<k)$ bits are convolutionally coded to produce an l-bit coder output ($l>j$). No conversion is made for higher $i (=k-j)$ bits. In this manner, the k-bit information ($k=i+j$) is convolutionally coded to be an m-bit code sequence ($m=i+l$). The $2^m$ convolutional codes are assigned into two-dimensional coordinates (I, Q) by the mapping device 62 and transmitted after quadrature amplitude modulation.

Figure 7:
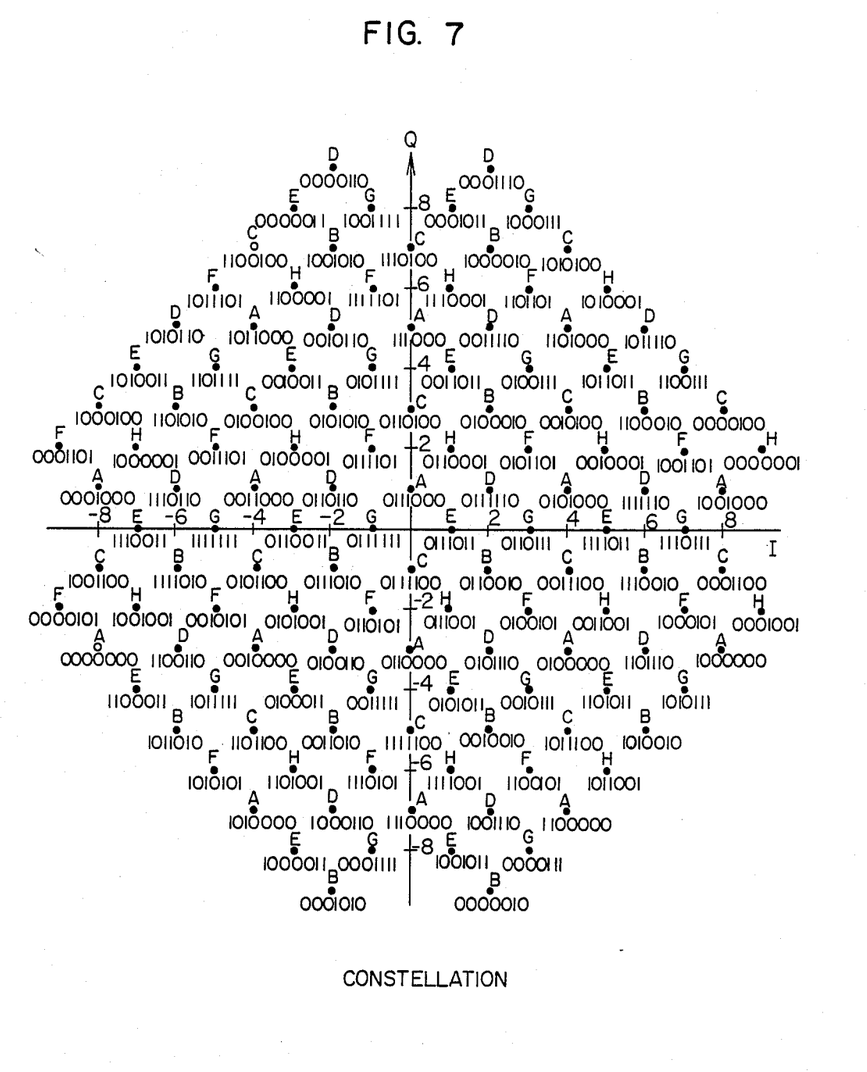
FIG. 7 shows an orthogonal coordinate representation of arrangement or constellation of signal points of output signals I, Q of FIG. 6.

FIG. 6 shows a convolutional coder where $i=4$ and $j=2$ and $l=3$ in FIG. 6 (hence $k=6$ and $m=7$). It is a convolutional coder for 14.4 K bps voice band data modem recommended in CCITT. A circuit to encode information sequences (data) I2 and I1 to $Y_{2n}$, $Y_{1n}$, $Y_{0n}$ is the same as that shown in FIG. 2. From the lower three bits thus generated and the higher four non converted bits, the 7-bit code sequence $Y_{6n}$, $Y_{5n}$, $Y_{4n}$, $Y_{3n}$, $Y_{2n}$, $Y_{1n}$, $Y_{0n}$ is produced. The code sequences are allocated into the constellation as shown in FIG. 7. They are transmitted after quadrature amplitude modulation. In FIG. 7, the 7-bit code sequences are allocated as follows. The lower three bits 000, 001, 010, 011, 100, 101, 110 and 111 are classified into groups A, H, B, E, C, F, D and G, respectively. Each group has sixteen signal points whose higher four bits are 0000-1111. The signal points in each group are arranged to have minimum Euclidean distances as large as possible. In FIG. 7, this distance is equal to 4. Then, higher four bits are assigned to the groups A-H. Specifically, the same higher four bits are assigned to four signal points which are equally spaced from an origin and relatively 90° apart from each other. In this manner, ambiguities of $n \times 90°$ (n: integer) carrier phases are eliminated. The three low order bits are also arranged to eliminate the ambiguities of $n \times 90°$ carrier phases. This is discussed in detail in the article "Rotationally Invariant Convolutional Channel Coding with Expanded Signal Space, Part II: Nonlinear Codes" by Lee-Fang Wei, IEEE Journal on Selected Areas in Communications, Vol. Sac-2, No. 5, pages 672–686 (1984).

Turning back to the embodiment of FIG. 5, path metric decision circuit 1, add/compare/select circuit 5 and path tracing circuit 8 form a maximum likelihood decoder for the lower three bits $Y_{2n}$, $Y_{1n}$, $Y_{0n}$, and are essentially identical to those shown in FIG. 1. The selection circuits 2a and 2b, memories 3a and 3b and combination decision circuit of FIG. 1 are omitted for simplification purpose.

Figure 8:
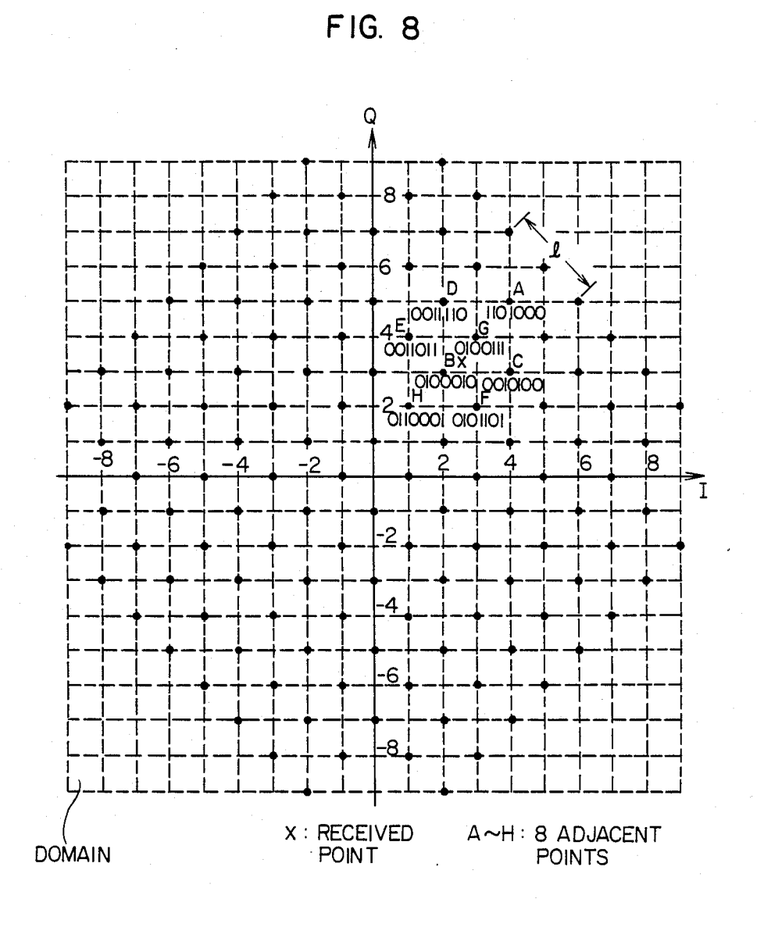
FIG. 8 shows an orthogonal coordinate representation of I, Q for explaining a principle of a domain decision circuit.

In this case, the structure of processing circuit 5 of ACS may be used of conventional circuit of ACS. (However, the domain decision circuit is not a part of the conventional system.) In the maximum likelihood decoder of the present embodiment, the lower three bits of the 7-bit code sequence are decoded, and then the higher four bits are decoded. When the signals I and Q transmitted through the quadrature amplitude modulation and affected by noise are supplied to the decoder, the domains are determined by the domain decision circuit 11. In the domain determination, the constellation is divided into small square domains as shown in FIG. 8 and the domain to which the received point (I, Q) belongs is determined. As an example, the received point (x) and the light adjacent signal points A, B, ..., H are shown.

In FIG. 8, an area of $-9 \leq I \leq 9$ and $-9 \leq Q \leq 9$ is divided into square domains although the received point may reach beyond this area. Accordingly, the domain determination must be done for a broader area (for example, $-16 \leq I \leq 16$ and $-16 \leq Q \leq 16$). The resulting domain information is stored in the memory 12 digitally.

The domain determination is significant in the following senses. If the domain to which the received point belongs is determined, all of the eight adjacent points A, B, ..., H to the received point are uniquely defined (see FIG. 8). This means that quite efficient decision of the path metric described above can be implemented. The domain information is also used to subsequently decode the higher four bits.

The lower three bits $Y_{2n}$, $Y_{1n}$, $Y_{0n}$ are decoded by the decoder comprising the path metric decision circuit 1 through the path tracing circuit 8, in the same manner as FIG. 1.

Then, the decoder 18 decodes the higher four bits based on the 3-bit decoded output and the domain information of truncation length before, shown in the circuit 8. This is done in the following manner. Referring to FIG. 7, the higher four bits and lower three bits of the code sequence are assigned to each signal point independently. It is not possible to directly decode the higher four bits based on only the lower three bits. Let us assume that a point X in FIG. 8 is received and is decoded as C (lower three bits are 100). The higher four bits of the point C should be decoded as 0010, but since there are 16 C's on the constellation (same is true for points other than C), information to discriminate C whose higher four bits are 0010 is required in order to decode the higher four bits. The domain information stored in the memory 12 is used as the discrimination signal. Thus, if the square domain to which the received point x belongs is determined, the light adjacent points A–H (and hence the higher four bits) are uniquely determined and the higher four bits can be decoded based on the domain information and the lower three bit information (A–H). In this example shown in FIG. 8, if C is decoded in the process of path tracing, the lower three bits are 100. Based on those bits and the square domain to which the point x belongs, the higher four bits of C are determined as 0010. Same is true for other points and domains.

In this manner, the seven bits $Y_{6n}$, $Y_{5n}$, $Y_{4n}$, $Y_{3n}$, $Y_{2n}$, $Y_{1n}$, $Y_{0n}$ are decoded and the redundant bit $Y_{0n}$ is erased to produce the 6-bit information sequence.

Figure 9:
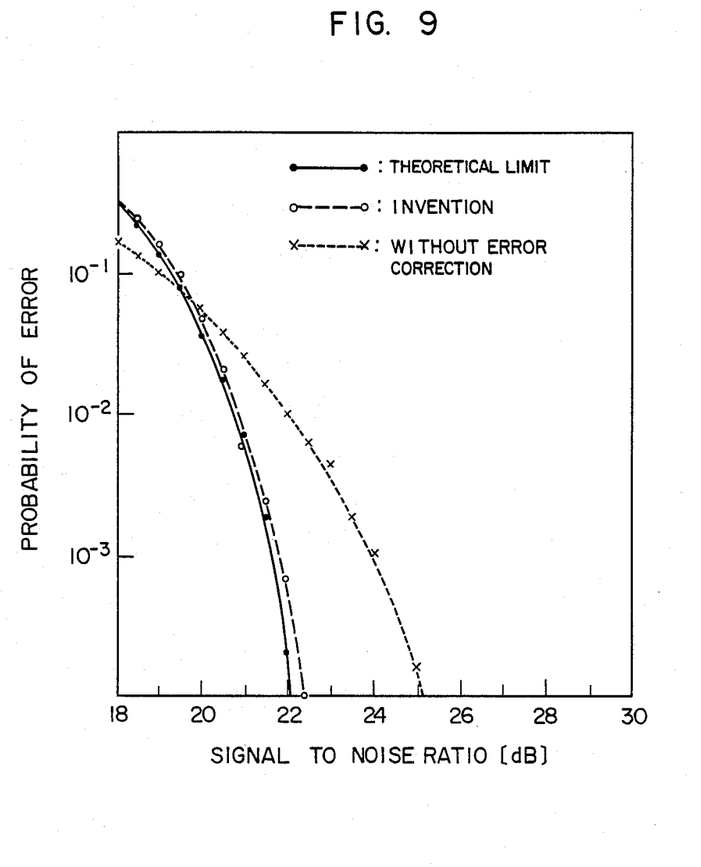
FIG. 9 shows a simulated result of an error rate performance of the maximum likelihood decoding by the embodiment of FIG. 5.

FIG. 9 shows simulation results of a decoding error rate (symbol error rate) when the embodiment of the maximum likelihood decoder of the present invention is applied to the convolutional code in FIG. 6. In FIG. 9, ∘-----∘ shows an error rate in the embodiment of the present invention where the number of state metric bit is 4, the number of path metric bits is 4, and the path truncation length is 15. In a quantamization step, the signal-to-signal distance 1 shown in FIG. 8 is equally divided into 16. In FIG. 9, •———• shows an error rate when the number of state metric bits and the number of path metric bits are infinite, and the path truncation length is 25. The decoding error rate can be considered very close to a theoretical bound.

By using the present embodiment, degradation in terms of signal to noise ratio from the theoretical bound of the decoding error rate performance can be suppressed within 0.2 dB and high performance decoding is achieved.

In accordance with the present invention, it is not necessary to perform the addition, comparison and selection for all combinations of the state metric and path metric on the trellis diagram but necessary for only the selected state metric and pat metric. Accordingly, the processing speed is higher than that of the conventional system and quite little performance degradation appears (see FIG. 4).

In accordance with the embodiment shown in FIG. 5, the domain decision is first performed to compress the information on the coordinate of the received point in the constellation into the information on the domain to which the received point belongs so that the decoder can be constructed by a simpler hardware configuration than that of the conventional system. Further, the path metric of the received point can be determined only for the adjacent signal points uniquely determined by the domain. Thus, high speed decoding is attained. Furthermore, the higher bits can be readily decoded based on the decoded lower bits and the domain information.

We claim:

1. A maximum likelihood decoder comprising:
   a path metric decision circuit for determining path metric of (an) input signal(s) against (a) reference signal(s);
   selection circuits for selecting n out of M (n<M) path metric determined by said path metric decision circuit in a descending order;
   first memories for storing m state metric selected in a descending order from M (m<M) state of metric before one symbol interval;
   first means for receiving the output of said selection circuits and the output of said first memories to determine a combination of states and paths to be operated;
   second means for adding, comparing and selecting against the m states and n paths determined by said first means;
   normalization means for normalizing the output of said second means and selecting the m state metric(s) at current time and storing the selected state metric(s) into said first memories;
   a path memory for storing paths connected to the current state metric(s) determined by said second means as survival paths; and
   a path tracing circuit for estimating a decoder output based on the survival paths stored in said path memory.

2. A maximum likelihood decoder according to claim 1 wherein said M, m and n meet;
   $0 \leq m < M$,
   $1 \leq n < M$, and
   $m + n \geq 2$.

3. A maximum likelihood decoder according to claim 2 wherein $M = 8$, and $n = m = 1$, or $m = 0$ and $n = 2$.

4. A maximum likelihood decoder according to claim 1, further comprising:
   a domain decision circuit for receiving a signal produced by convolutionally coding only lower j bits out of k-bit information sequence ($k \geq 2$) into l ($l > j$) bits with non-converting i higher ($i = k - j$) bits to produce an (i+l)-bit convolutional code, and quadrature amplitude-modulating the convolutional code according to signal point mapping or constellation, dividing the two dimensional area of the signal point mapping into small domains, determining a small domain to which the received signal point belongs and supplying the received signal point and said domain to said path metric decision circuit; and
   higher i bit decoding means for decoding the i bits based on the information on the domain to which the received point belongs produced by said domain decision circuit.

* * * * *